(12) United States Patent
Kushida

(10) Patent No.: US 8,537,597 B2
(45) Date of Patent: Sep. 17, 2013

(54) SEMICONDUCTOR MEMORY DEVICE

(75) Inventor: Keiichi Kushida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/420,896

(22) Filed: Mar. 15, 2012

(65) Prior Publication Data

US 2013/0135918 A1    May 30, 2013

(30) Foreign Application Priority Data

Nov. 30, 2011    (JP) .................................. 2011-262841

(51) Int. Cl.
*G11C 14/00*    (2006.01)
*G11C 13/00*    (2006.01)
*G11C 16/02*    (2006.01)
*G11C 11/00*    (2006.01)

(52) U.S. Cl.
USPC .......................................... 365/148; 365/154

(58) Field of Classification Search
USPC .................................................. 365/148, 154
See application file for complete search history.

(56) References Cited

U.S. PATENT DOCUMENTS

| | | | |
|---|---|---|---|
| 6,556,487 B1 * | 4/2003 | Ratnakumar et al. ..... | 365/185.08 |
| 6,944,050 B2 | 9/2005 | Kang et al. | |
| 2008/0225590 A1 * | 9/2008 | Lamorey .................. | 365/185.05 |
| 2011/0085372 A1 | 4/2011 | Fackenthal | |
| 2011/0280073 A1 * | 11/2011 | Chiu et al. ............... | 365/185.08 |
| 2012/0020159 A1 * | 1/2012 | Ong .......................... | 365/185.08 |
| 2012/0320658 A1 * | 12/2012 | Wang et al. .................. | 365/148 |

FOREIGN PATENT DOCUMENTS

| | | |
|---|---|---|
| JP | 2010-176843 | 8/2010 |
| JP | 2010-232959 | 10/2010 |
| JP | 2011-081896 | 4/2011 |

OTHER PUBLICATIONS

Pi-Feng Chiu, A Low Store Energy, Low VDDmin, Nonvolatile 8T2R SRAM with 3D Stacked RRAM Devices for Low Power Mobile App;ications, 2010 Symposium on VLSI Circuits/Technical Digest of Technical Papers, pp. 229-230.

Koji Nii, A 90nm Dual-Port SRAM with 2.04 um 8T-Thin Cell Using Dynamically-Controlled Column Bias Scheme, ISSCC 2004/Session 27/Sram/27.9, pages.

Pi-Feng Chiu, A Low Store Energy, Low VDDmin, Nonvolatile 8T2R SRAM with 3D Stacked RRAM Devices for Low Power Mobile Applications, 2010 Symposium on VLSI Circuits/Technical Digest of Technical Papers, pp. 229-230.

* cited by examiner

*Primary Examiner* — Hoai V Ho
*Assistant Examiner* — Jay Radke
(74) *Attorney, Agent, or Firm* — Knobbe, Martens, Olson and Bear, LLP

(57) ABSTRACT

According to one embodiment, there is provided a semiconductor memory device including a memory cell. The memory cell includes a first driving transistor, a first load transistor, a first read transfer transistor, a first write transfer transistor, a second driving transistor, a second load transistor, a second read transfer transistor, a second write transfer transistor, and one or more variable resistance elements. The one or more variable resistance elements has resistance that changes depending on a direction of a bias applied to both terminals. The one or more variable resistance elements are arranged in at least one of a portion between a first storage node and a first write transfer transistor and a portion between a second storage node and a second write transfer transistor.

17 Claims, 10 Drawing Sheets

On: LOW RESISTANCE

Off: HIGH RESISTANCE

SEMICONDUCTOR MEMORY DEVICE

CROSS-REFERENCE TO RELATED APPLICATIONS

This application is based upon and claims the benefit of priority from Japanese Patent Application No. 2011-262841, filed on Nov. 30, 2011; the entire contents of which are incorporated herein by reference.

FIELD

Embodiments described herein relate generally to a semiconductor memory device.

BACKGROUND

Static random access memories (SRAMs) need not perform a refresh operation and so are lower in power consumption and faster in operation speed than dynamic random access memories (DRAMs). For this reasons, SRAMs are widely used as cash memories of computers or portable electronic products. In a case in which a computer is a notebook computer or a portable electronic product, back-up power is supplied to an SRAM at the time of power-off so as to retain data stored in the SRAM. This is one of causes of increasing power consumption at the time of power-off. Thus, it is desirable to reduce power consumption at the time of power-off in SRAMs.

DETAILED DESCRIPTION

In general, according to one embodiment, there is provided a semiconductor memory device including a memory cell. The memory cell includes a first driving transistor, a first load transistor, a first read transfer transistor, a first write transfer transistor, a second driving transistor, a second load transistor, a second read transfer transistor, a second write transfer transistor, and one or more variable resistance elements. The first driving transistor is connected to a first storage node. The first load transistor is connected to the first storage node. The first read transfer transistor is arranged between the first storage node and a first read node. The first write transfer transistor is arranged between the first storage node and a first write node. The second driving transistor is connected to a second storage node. The second load transistor is connected to the second storage node. The second read transfer transistor is arranged between the second storage node and a second read node. The second write transfer transistor is arranged between the second storage node and a second write node. The one or more variable resistance elements has resistance that changes depending on a direction of a bias applied to both terminals. The one or more variable resistance elements are arranged in at least one of a portion between the first storage node and the first write transfer transistor and a portion between the second storage node and the second write transfer transistor.

Exemplary embodiments of a semiconductor memory device will be explained below in detail with reference to the accompanying drawings. The present invention is not limited to the following embodiments.

First Embodiment

Figure 1:
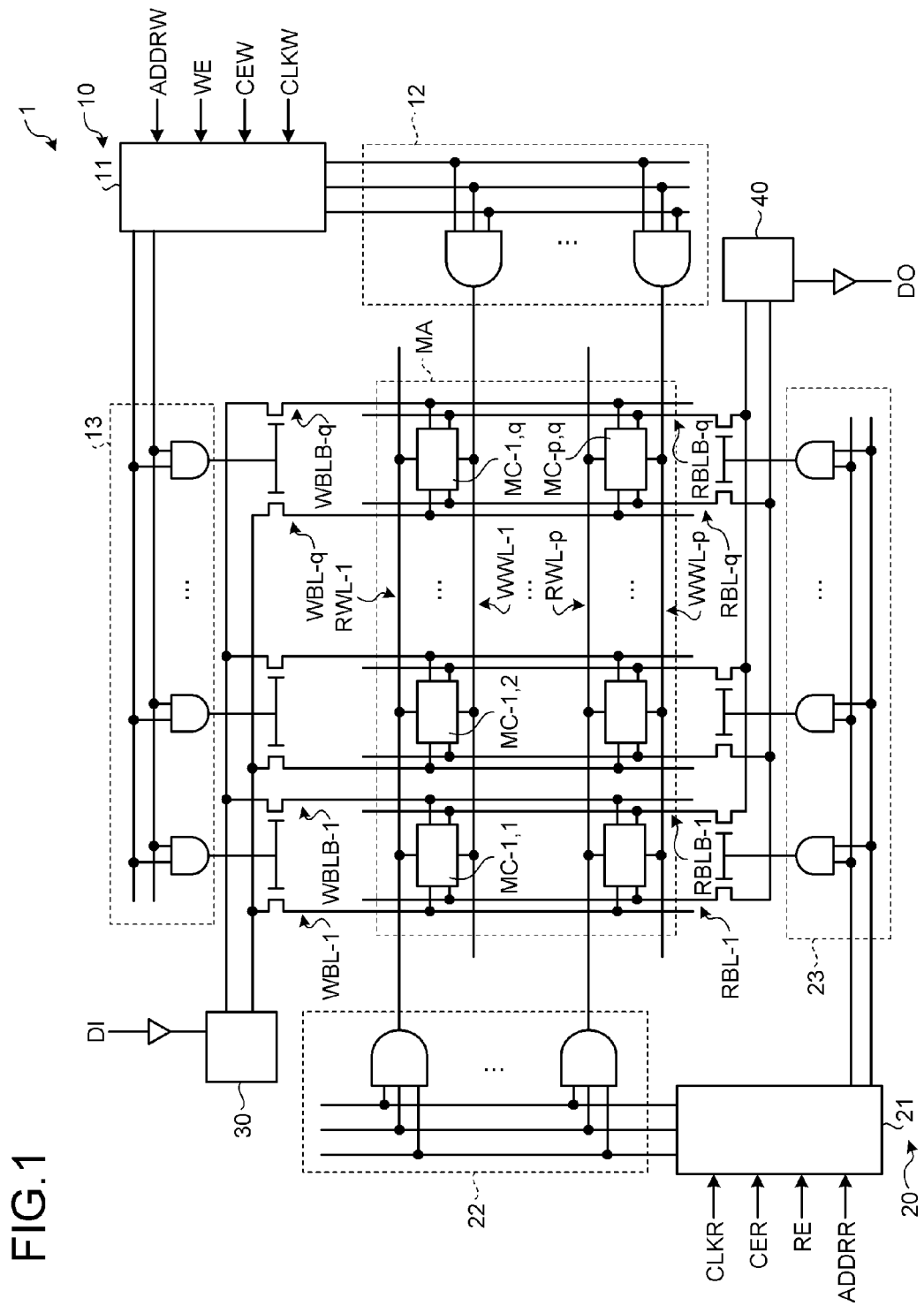
FIG. 1 is a diagram illustrating a configuration of a semiconductor memory device according to a first embodiment.

A semiconductor memory device 1 according to a first embodiment will be described with reference to FIG. 1. FIG. 1 is a diagram illustrating a configuration of the semiconductor memory device 1.

For example, the semiconductor memory device 1 is an SRAM. The semiconductor memory device 1 illustrated in FIG. 1 includes a memory cell array MA, a plurality of write word lines WWL-1 to WWL-p, a plurality of read word lines RWL-1 to RWL-p, a plurality of write bit lines WBL-1 to WBL-q, a plurality of inverted write bit lines WBLB-1 to WBLB-q, a plurality of read bit lines RBL-1 to RBL-q, a plurality of inverted read bit lines RBLB-1 to RBLB-q, a write control unit 10, a write driver 30, a read control unit 20, and a sense amplifier 40.

In the memory cell array MA, a plurality of memory cells MC are arranged in a row direction and a column direction. For example, a plurality of memory cells MC may be arranged in the form of a p×q matrix. Here, each of p and q is a positive integer larger than 1.

The plurality of write word lines WWL extend in a row direction and are connected to a plurality of memory cells MC in units of rows. The plurality of read word lines RWL extend in the row direction and are connected to a plurality of memory cells MC in units of rows. For example, the write word line WWL and the read word line RWL are connected to the memory cells MC of a corresponding row at sides opposite to each other in a column direction.

The plurality of write bit lines WBL extend in the column direction and connected to the plurality of memory cells MC in units of columns. The plurality of inverted write bit lines WBLB extend in the column direction and connected to the plurality of memory cells MC in units of columns. For example, the write bit line WBL and the inverted write bit line WBLB are connected to the memory cells MC of a corresponding column at both sides in the row direction.

The plurality of read bit lines RBL extend in the column direction and are connected to the plurality of memory cells MC in units of columns. The plurality of inverted read bit lines RBLB extend in the column direction and are connected to the plurality of memory cells MC in units of columns. For example, the read bit line RBL and the inverted read bit line RBLB are connected to the memory cells MC of a corresponding column at both sides in the row direction.

The write control unit 10 controls an operation of writing data in the plurality of memory cells MC. The write control unit 10 includes a write controller 11, a write row decoder 12, and a write column decoder 13.

The write controller 11 receives a write address signal ADDRW, a write enable signal WE, a write chip enable signal CEW, and a write clock CLKW, and controls the write row decoder 12 and the write column decoder 13 using the signals such that memory cells MC of a predetermined row and a predetermined column are selected. The write row decoder 12 selects a write word line WWL of a predetermined row and supplies the selected write word line WWL with a control signal of an active level. The write column decoder 13 selects a write bit line WBL and an inverted write bit line WBLB of a predetermined column and electrically connects the selected bit lines with the write driver 30.

The write driver 30 receives data DI to be written, generates a signal corresponding to the data DI, and supplies the generated signal to a write bit line WBL and an inverted write bit line WBLB of a selected column. As a result, the signal corresponding to the data DI is written in the selected memory cells MC.

The read control unit 20 controls an operation of reading data from a plurality of memory cells MC. The read control unit 20 includes a read controller 21, a read row decoder 22, and a read column decoder 23.

The read controller 21 receives a read address signal ADDRR, a read enable signal RE, a read chip enable signal CER, and a read clock CLKR, and controls the read row decoder 22 and the read column decoder 23 using the signals such that memory cells MC of a predetermined row and a predetermined column are selected. The read row decoder 22 selects a read word line RWL of a predetermined row, and supplies the selected read word line RWL with a control signal of an active level. The read column decoder 23 selects a read bit line RBL and an inverted read bit line RBLB of a predetermined row and electrically connects the selected bit lines with the sense amplifier 40.

The sense amplifier 40 reads a signal written in the selected memory cells MC through the read bit line RBL and the inverted read bit line RBLB, generates data DO corresponding to the read signal, and outputs the generated data DO.

For example, the semiconductor memory device 1 illustrated in FIG. 1 is a dual-port type SRAM, and can access each memory cell MC independently from a write port and a read port. In other words, for each memory cell MC, the write bit line WBL and the inverted write bit line WBLB may be used as the write port, and the read bit line RBL and the inverted read bit line RBLB may be used as the read port. On the other hand, the write control unit 10 and the read control unit 20 are arranged in separate systems and operate independently of each other.

Figure 2A:
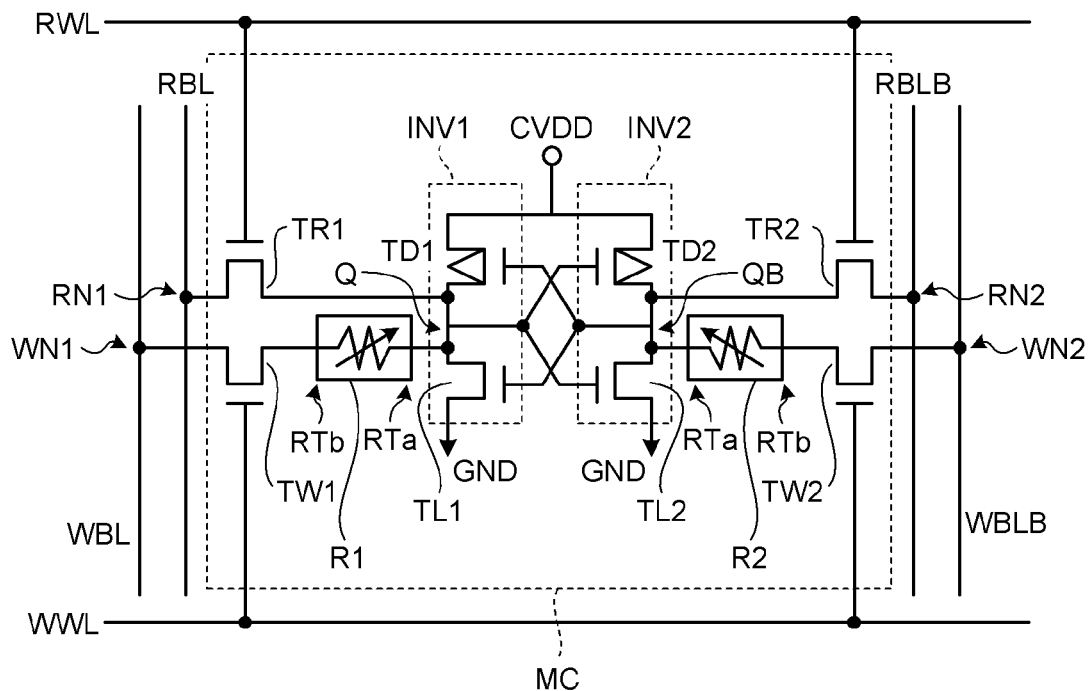
FIGS. 2A to 2C are diagrams illustrating a configuration of a memory cell according to the first embodiment.

Next, a configuration of the memory cell MC will be described with reference to FIG. 2A. FIG. 2A is a diagram illustrating a configuration of the memory cell MC.

The memory cell MC includes a driving transistor TD1, a load transistor TL1, a write transfer transistor TW1, a read transfer transistor TR1, a driving transistor TD2, a load transistor TL2, a write transfer transistor TW2, a read transfer transistor TR2, a variable resistance element R1, and a variable resistance element R2.

The driving transistor TD1, the load transistor TL1, the write transfer transistor TW1, the read transfer transistor TR1, the driving transistor TD2, the load transistor TL2, the write transfer transistor TW2, and the read transfer transistor TR2 configure an 8-transistor type SRAM cell. In other words, the load transistor TL1 and the driving transistor TD1 configure an inverter INV1, and the load transistor TL2 and the driving transistor TD2 configure an inverter INV2. An output terminal of the inverter INV1 is connected to an input terminal of the inverter INV2, and an output terminal of the inverter INV2 is connected to an input terminal of the inverter INV1. The inverter INV1 and the inverter INV2 configure a flip flop.

The driving transistor TD1 is connected between a storage node Q of the flip flop and a cell power node CVDD. The load transistor TL1 is connected between the storage node Q and a ground node GND. The read transfer transistor TR1 is connected between the storage node Q and a read node RN1. Further, the variable resistance element R1 and the write transfer transistor TW1 are sequentially connected between the storage node Q and a write node WN1. That is, the variable resistance element R1 is connected between the storage node Q and the write transfer transistor TW1.

Figure 2B:
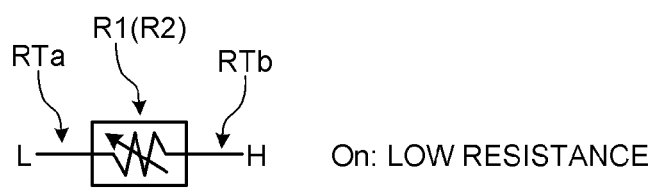
Figure 2C:
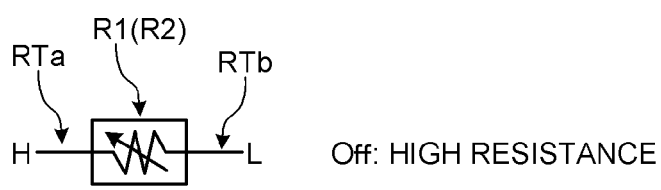

The variable resistance element R1 has resistance that changes depending on a direction of a bias applied to both terminals thereof as illustrated in FIGS. 2B and 2C. For example, memory devices such as a ReRAM, an MRAM, and a FeRAM may be used as the variable resistance element R1. In the following, a description will be made in connection with an example in which a ReRAM memory device is used as the variable resistance element R1.

Here, the variable resistance element R1 includes a terminal to which a high voltage is applied at the time of a forming operation as one terminal RTa and a terminal at an opposite side as the other terminal RTb. When a low (L) level is applied to one terminal RTa and a high (H) level is applied to the other terminal RTb, the variable resistance element R1 performs a set operation, decreases in resistance, and becomes an on state (see FIG. 2B). However, when the H level is applied to one terminal RTa and the L level is applied to the other terminal RTb, the variable resistance element R1 performs a reset operation, increases in resistance, and becomes an off state (see FIG. 2C). For example, the variable resistance element R1 has a resistance value of about several ohms Ω in the on state (the low resistance state) and a resistance value of about several kilo ohms kΩ in the off state (the high resistance state).

In the variable resistance element R1 illustrated in FIG. 2A, one terminal RTa is connected to the storage node Q, and the other terminal RTb is connected to the write transfer transistor TW1.

The driving transistor TD2 is connected between a storage node QB of the flip flop and the cell power node CVDD. The load transistor TL2 is connected between the storage node QB and the ground node GND. The read transfer transistor TR2 is connected between the storage node QB and a read node RN2. Further, the variable resistance element R2 and the write transfer transistor TW2 are sequentially connected between the storage node QB and a write node WN2. That is, the variable resistance element R2 is connected between the storage node QB and the write transfer transistor TW2.

The variable resistance element R2 has resistance that changes depending on a direction of a bias applied to both terminals thereof as illustrated in FIGS. 2B and 2C. For example, memory devices such as a ReRAM, an MRAM, and a FeRAM may be used as the variable resistance element R2. In the following, a description will be made in connection with an example in which a ReRAM memory device is used as the variable resistance element R2.

Here, the variable resistance element R2 includes a terminal to which a high voltage is applied at the time of a forming operation as one terminal RTa and a terminal at an opposite side as the other terminal RTb. When the L level is applied to one terminal RTa and the H level is applied to the other terminal RTb, the variable resistance element R2 performs the set operation, decreases in resistance, and becomes the on state (see FIG. 2B). However, when the H level is applied to one terminal RTa and the L level is applied to the other terminal RTb, the variable resistance element R2 performs the reset operation, increases in resistance, and becomes the off state (see FIG. 2C). For example, the variable resistance element R2 has a resistance value of about several ohms Ω in the on state (the low resistance state) and a resistance value of about several kilo ohms kΩ in the off state (the high resistance state).

In the variable resistance element R2 illustrated in FIG. 2A, one terminal RTa is connected to the storage node QB, and the other terminal Rib is connected to the write transfer transistor TW2.

Figure 3:
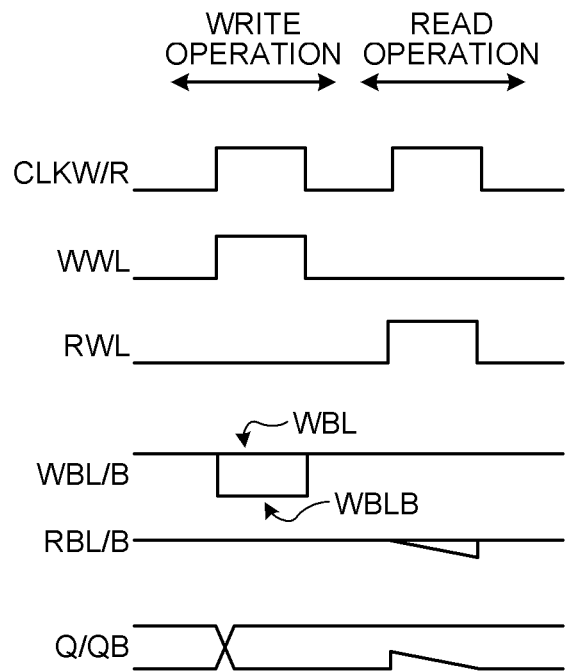
FIG. 3 is a diagram illustrating an operation of the memory cell according to the first embodiment.
Figure 4:
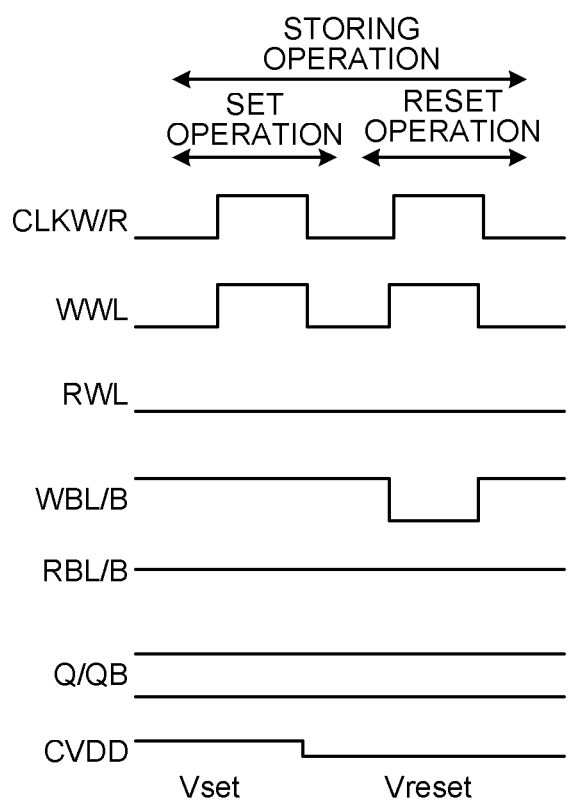
FIG. 4 is a diagram illustrating an operation of the memory cell according to the first embodiment.
Figure 5:
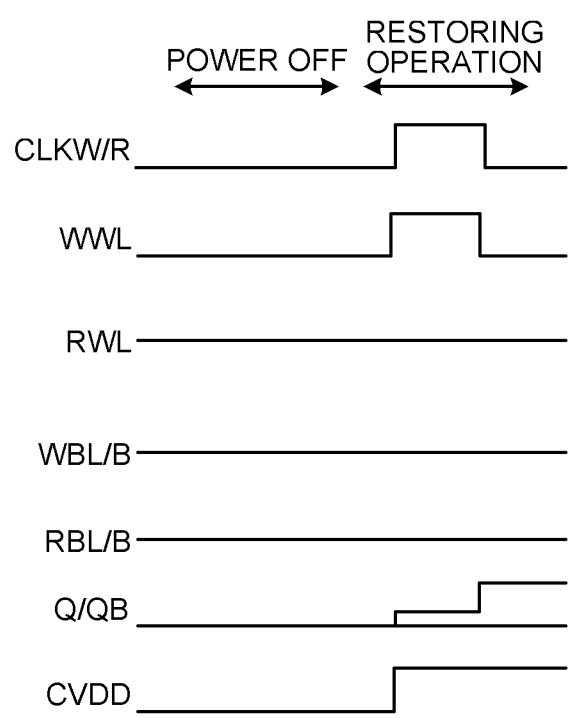
FIG. 5 is a diagram illustrating an operation of the memory cell according to the first embodiment.

Next, an operation of the memory cell MC will be described with reference to FIGS. 3 to 5. FIGS. 3 to 5 are waveform diagrams illustrating an operation of the memory cell MC.

As illustrated in FIG. 3, in the operation of writing data in the memory cell MC, the H level and the L level are applied, for example, to the write bit line WBL and the inverted write bit line WBLB, respectively, in a state in which the H level is applied to the write word line WWL. As a result, signals (for example, the H level and the L level) corresponding to data are written in the storage node Q and the storage node QB of the memory cell MC, respectively. Alternatively, for example, the L level and the H level are applied, for example, to the write bit line WBL and the inverted write bit line WBLB, respectively. As a result, signals (for example, the L level and the H level) corresponding to data are written in the storage node Q and the storage node QB of the memory cell MC.

Further, in the operation of reading data from the memory cell MC, potentials of the read bit line RBL and the inverted read bit line RBLB are sense-amplified in a state in which the H level is applied to the read word line RWL. As a result, data corresponding to signals is read from the storage node Q and the storage node QB of the memory cell MC.

According to the present embodiment, as illustrated in FIG. 4, a storing operation of backing up data written in the storage node Q and the storage node QB of the memory cell MC to the variable resistance elements R1 and R2 is performed before power is turned off. In the storing operation, the set operation and the reset operation of the variable resistance elements R1 and R2 are sequentially performed.

In the set operation, potential of the cell power node CVDD is set to Vset which is different from VDD at the time of the write operation or the read operation. The H level (Vset) is applied to both the write bit line WBL and the inverted write bit line WBLB in a state in which the H level is applied to the write word line WWL.

At this time, for example, when the storage node Q and the storage node QB remain the H level and the L level, respectively, a bias is not actually applied to both terminals of the variable resistance element R1, however, a bias illustrated in FIG. 2B is applied to both terminals of the variable resistance element R2. As a result, the variable resistance element R2 selectively performs the set operation and changes to the on state (the low resistance state), and the L level of the storage node QB is backed up to the variable resistance element R2 as the on state (the low resistance state).

Alternatively, for example, when the storage node Q and the storage node QB remain the L level and the H level, respectively, a bias is not actually applied to both terminals of the variable resistance element R2, however, a bias illustrated in FIG. 2B is applied to both terminals of the variable resistance element R1. As a result, the variable resistance element R1 selectively performs the set operation and changes to the on state (the low resistance state), and the L level of the storage node Q is backed up to the variable resistance element R1 as the on state (the low resistance state).

Next, in the reset operation, potential of the cell power node CVDD is set to Vreset which is different from VDD and Vset. The L level is applied to both the write bit line WBL and the inverted write bit line WBLB in a state in which the H level is applied to the write word line WWL.

At this time, for example, when the storage node Q and the storage node QB remain the H level and the L level, respectively, a bias is not actually applied to both terminals of the variable resistance element R2, however, a bias illustrated in FIG. 2C is applied to both terminals of the variable resistance element R1. As a result, the variable resistance element R1 selectively performs the reset operation and changes to the off state (the high resistance state), and the H level of the storage node Q is backed up to the variable resistance element R1 as the off state (the high resistance state).

Alternatively, for example, when the storage node Q and the storage node QB remain the L level and the H level, respectively, a bias is not actually applied to both terminals of the variable resistance element R1, however, a bias illustrated in FIG. 2C is applied to both terminals of the variable resistance element R2. As a result, the variable resistance element R2 selectively performs the reset operation and changes to the off state (the high resistance state), and the H level of the storage node QB is backed up to the variable resistance element R2 as the off state (the high resistance state).

In this way, the signals held in the storage node Q and the storage node QB are backed up to the variable resistance elements R1 and R2, and the variable resistance elements R1 and R2 store the backed-up signals in a non-volatile manner. As a result, the memory cell MC holds data in a non-volatile manner even though power is turned off as illustrated in FIG. 5.

According to the present embodiment, as illustrated in FIG. 5, after power is turned on again, a restoring operation of returning data, which has been written in the storage node Q and the storage node QB of the memory cell MC, from the variable resistance elements R1 and R2 to the storage node Q and the storage node QB is performed.

In the restoring operation, potential of the cell power node CVDD is raised from potential (L level) at the time of power-off to VDD in a state in which the H level is applied to the write word line WWL. At this time, potentials of the write bit line WBL and the inverted write bit line WBLB maintain potential (L level) at the time of power-off "as is".

At this time, for example, when the variable resistance element R1 and the variable resistance element R2 are in the off state (the high resistance state) and the on state (the low resistance state), respectively, since the storage node QB is more strongly drawn to the L level than the storage node Q, the storage node Q and the storage node QB are charged to the H level and the L level, respectively. As a result, the H level and the L level originally written in the storage node Q and the storage node QB, respectively, can be returned to the storage node Q and the storage node QB.

Alternatively, for example, when the variable resistance element R1 and the variable resistance element R2 are in the on state (the low resistance state) and the off state (the high resistance state), respectively, since the storage node Q is more strongly drawn to the L level than the storage node QB, the storage node Q and the storage node QB are charged to the L level and the H level, respectively. As a result, the L level and the H level originally written in the storage node Q and the storage node QB, respectively, can be returned to the storage node Q and the storage node QB.

Preferably, the storing operation illustrated in FIG. 4 and the restoring operation illustrated in FIG. 5 are performed collectively on all memory cells MC in the memory cell array MA by the write controller 11 or the read controller 21 illustrated in FIG. 1. Alternatively, the write controller 11 or the read controller 21 may divide the memory cell array MA into a plurality of blocks, manage whether to perform the write operation or the read operation on each block using a management table or the like, and selectively perform the storing operation or the restoring operation on a block which has been subjected to the write operation or the read operation.

As described above, according to the first embodiment, in the memory cell MC, the variable resistance element R1 is connected between the storage node Q and the write transfer transistor TW1, and the variable resistance element R2 is connected between the storage node QB and the write transfer transistor TW2. Through this configuration, even though back-up power is not supplied at the time of power-off, the memory cell MC can hold data in a non-volatile manner, and thus power consumption at the time of power-off can be reduced.

Further, according to the first embodiment, the semiconductor memory device 1 is, for example, a dual-port type SRAM and can access the memory cell MC independently from the write port and the read port. Thus, the write process and the read process can be performed on a plurality of memory cells MC in parallel, and thus a data processing speed can be generally improved compared to the single-port type SRAM.

Furthermore, according to the first embodiment, the write transfer transistors TW1 and TW2 function as not only a transfer gate in the write operation of the memory cell MC but also a control gate in the storing operation and the restoring operation of the memory cell MC. As a result, a memory cell MC with non-volatility can be implemented without newly adding the control gate in the storing operation and the restoring operation of the memory cell MC. That is, an SRAM including memory cells MC with non-volatility can be implemented while suppressing an increase in the circuit size.

Second Embodiment

Next, a semiconductor memory device 100 according to a second embodiment will be described. In the following, a description will be made in connection with points different from the first embodiment.

In the first embodiment, potential of the cell power node CVDD is set to VDD (H level) in the operation of writing data in the memory cell MC. However, according to the second embodiment, potential of the cell power node CVDD is temporarily lowered to the L level in the operation of writing data in the memory cell MC.

Figure 6:
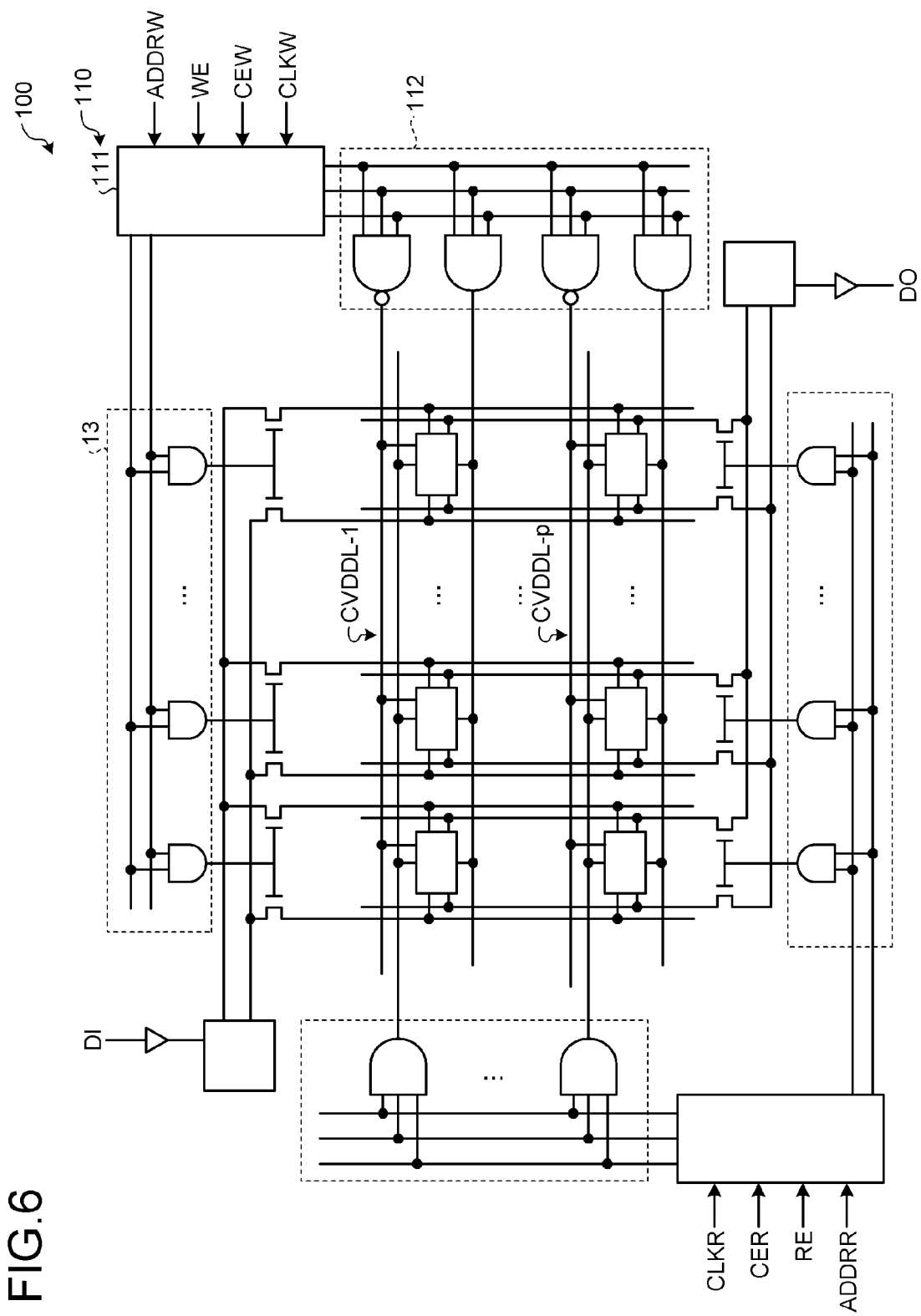
FIG. 6 is a diagram illustrating a configuration of a semiconductor memory device according to a second embodiment.
Figure 7:
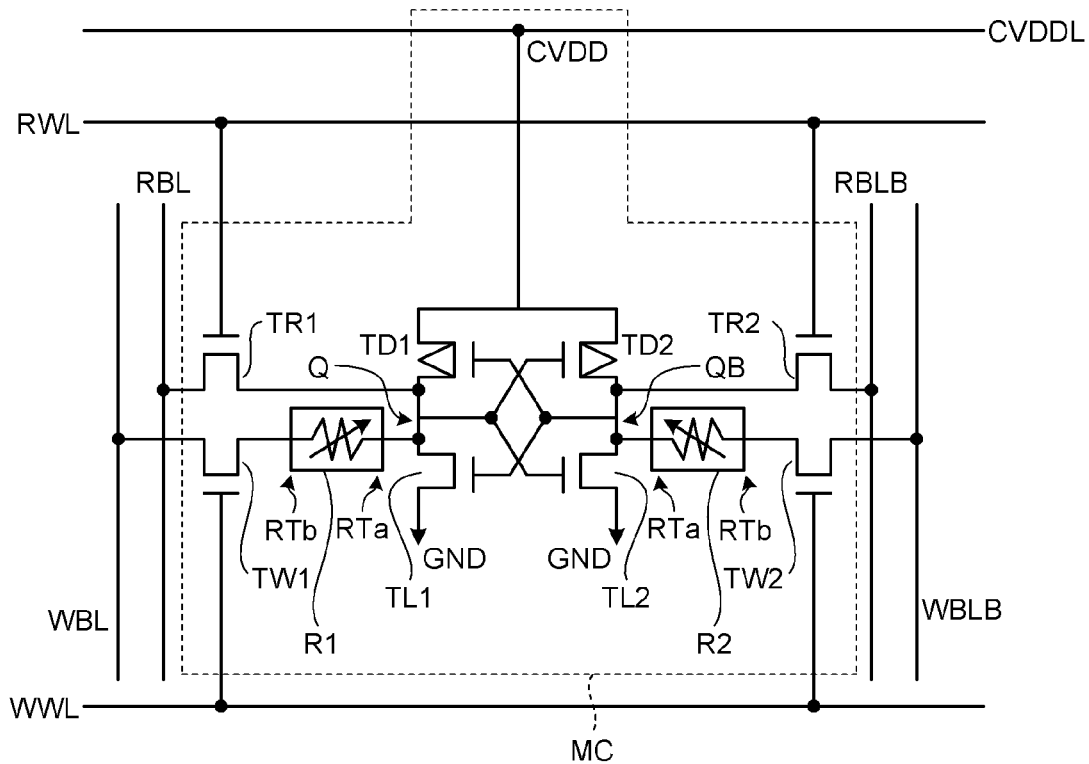
FIG. 7 is a diagram illustrating a configuration of a memory cell according to the second embodiment.

Specifically, the semiconductor memory device 100 includes a plurality of cell power lines CVDDL-1 to CVDDL-p and a write control unit 110 as illustrated in FIG. 6. The plurality of cell power lines CVDDL extend in the row direction and are connected to a plurality of memory cells MC in units of rows. For example, the cell power line CVDDL and the write word line WWL are connected to memory cells MC of a corresponding row at the same side in the column direction. For example, the cell power line CVDDL is commonly connected to cell power nodes CVDD of memory cells MC of a corresponding row (see FIG. 7).

A write controller 111 of the write control unit 110 controls a write row decoder 112 such that potential of a cell power line CVDDL of a selected row is selectively, temporarily lowered to the L level. The write row decoder 112 selectively, temporarily lowers potential of a cell power line CVDDL of a selected row to the L level while maintaining potential of a cell power line CVDDL of a non-selected row to VDD (H level).

Figure 8:
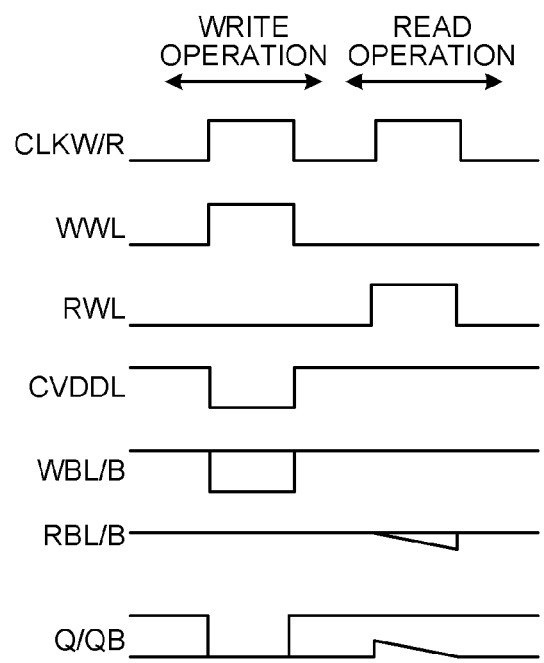
FIG. 8 is a diagram illustrating an operation of the memory cell according to the second embodiment.

Specifically, as illustrated in FIG. 8, potential of the cell power line CVDDL is lowered from VDD (H level) to the L level in the operation of writing data in the memory cell MC. After a sufficient time, which causes potentials of the storage nodes Q and QB to become the L level, elapses, predetermined levels are applied to the write bit line WBL and the inverted write bit line WBLB, respectively, in a state in which the H level is applied to the write word line WWL. As a result, signals corresponding to data are written in the variable resistance elements R1 and R2.

For example, when the H level and the L level are applied to the write bit line WBL and the inverted write bit line WBLB, respectively, a bias is not actually applied to both terminals of the variable resistance element R2, however, a bias illustrated in FIG. 2B is applied to both terminals of the variable resistance element R1. As a result, the variable resistance element R1 selectively performs the set operation and changes to the on state (the low resistance state).

Alternatively, for example, when the L level and the H level are applied to the write bit line WBL and the inverted write bit line WBLB, respectively, a bias is not actually applied to both terminals of the variable resistance element R1, however, a bias illustrated in FIG. 2B is applied to both terminals of the variable resistance element R2. As a result, the variable resistance element R1 selectively performs the set operation and changes to the on state (the low resistance state).

Thereafter, potential of the cell power line CVDDL is raised from the L level to VDD (H level). As a result, signals corresponding to data are written in the storage node Q and the storage node QB of the memory cell MC.

For example, when potential of the cell power line CVDDL is raised to VDD (H level) in a state in which the H level and the L level are applied to the write bit line WBL and the inverted write bit line WBLB, respectively, a bias illustrated in FIG. 2C is applied to both terminals of the variable resistance element R2. As a result, the variable resistance element R2 selectively performs the reset operation and changes to the off state (the high resistance state). In other words, when the variable resistance element R1 and the variable resistance element R2 are in the on state (the low resistance state) and the off state (the high resistance state), respectively, the storage node Q is more strongly drawn to the H level than the storage node QB. Thus, the storage node Q and the storage node QB are charged to the H level and the L level, respectively. As a result, the H level and the L level can be written in the storage node Q and the storage node QB, respectively.

Alternatively, for example, when potential of the cell power line CVDDL is raised to VDD (H level) in a state in which the L level and the H level are applied to the write bit line WBL and the inverted write bit line WBLB, respectively, a bias illustrated in FIG. 2C is applied to both terminals of the variable resistance element R1. As a result, the variable resistance element R1 selectively performs the reset operation and changes to the off state (the high resistance state). In other words, when the variable resistance element R1 and the variable resistance element R2 are in the off state (the high resistance state) and the on state (the low resistance state), respectively, the storage node QB is more strongly drawn to the H level than the storage node Q. Thus, the storage node Q and the storage node QB are charged to the L level and the H level, respectively. As a result, the L level and the H level can be written in the storage node Q and the storage node QB, respectively.

As described above, according to the second embodiment, during the operation of writing data in the storage nodes Q and QB of the memory cell MC, control is performed such that potential of the cell power node CVDD is raised from the H level to the L level, remains the L level, and is returned from the L level to the H level. As a result, even when resistances of the variable resistance elements R1 and R2 in the off state are sufficiently high, the L level can be easily written in a bit line connected to the variable resistance element R1 or R2 at the high resistance side.

For example, when the widths of the variable resistance elements R1 and R2 in a direction perpendicular to a current path decrease to reduce the cell size of the memory cell MC, resistances of the variable resistance elements R1 and R2 are likely to increase. As described above, according to the second embodiment, the area size of the memory cell MC can be reduced, and signals of appropriate levels can be written in the storage node Q and the storage node QB, respectively.

Third Embodiment

Next, a semiconductor memory device 200 according to a third embodiment will be described. In the following, a description will be made in connection with points different from the second embodiment.

In the second embodiment, potential of the cell power node CVDD is temporarily lowered to the L level during the operation of writing data in the memory cell MC. However, according to the third embodiment, when potential of the cell power node CVDD is lowered to the L level, control is performed such that potentials of the storage node Q and QB are equally lowered to the L level.

Figure 9:
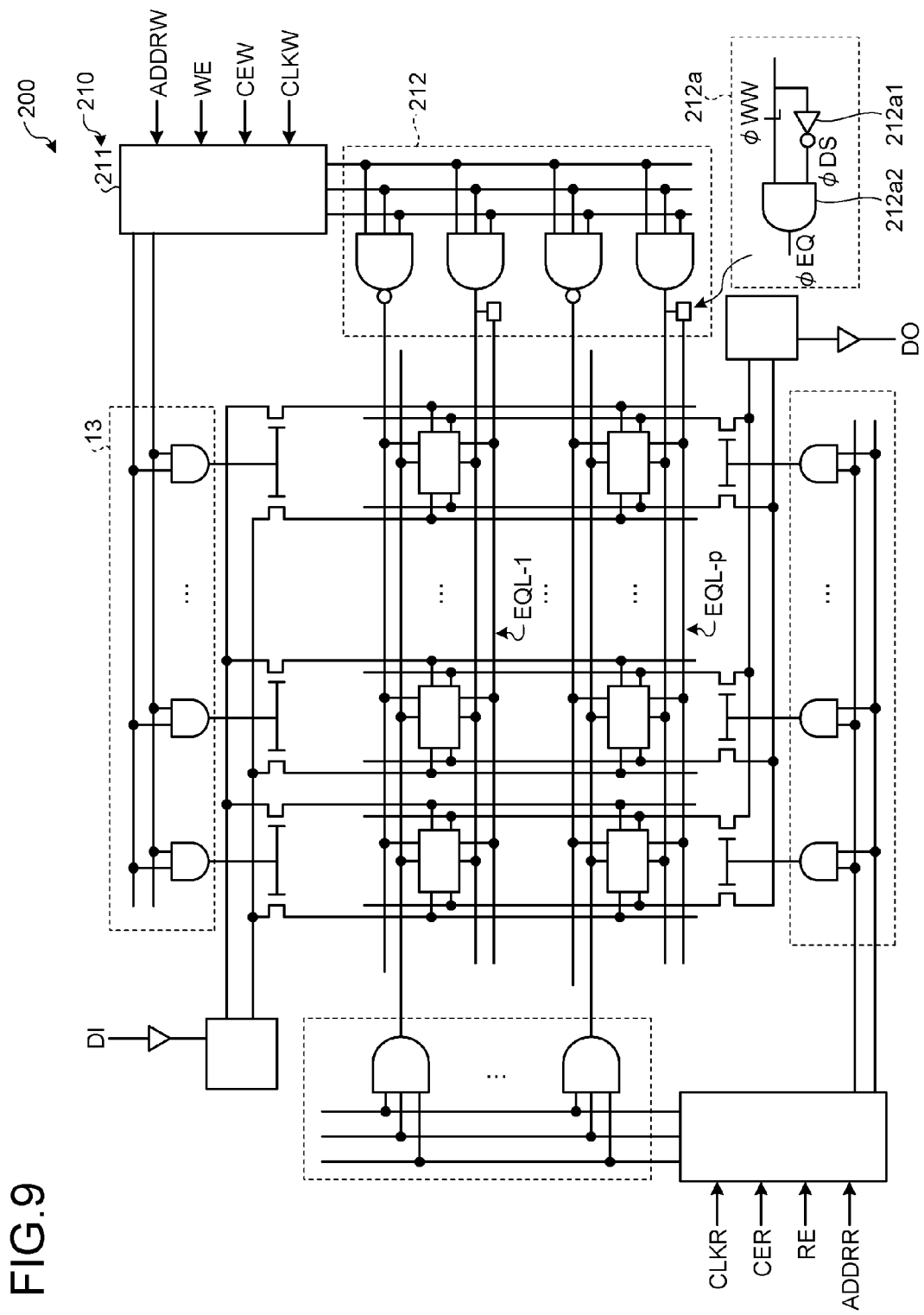
FIG. 9 is a diagram illustrating a configuration of a semiconductor memory device according to a third embodiment.

Specifically, the semiconductor memory device 200 includes a plurality of equalizing control lines EQL-1 to EQL-p and a write control unit 210 as illustrated in FIG. 9. The plurality of equalizing control lines EQL extend in the row direction and are connected to a plurality of memory cells MC in units of rows. For example, the equalizing control line EQL and the cell power line CVDDL are connected to memory cells MC of a corresponding row at sides opposite to each other in the column direction. For example, the equalizing control line EQL is commonly connected to gates of equalizing transistors TE of memory cells MC of a corresponding row (see FIG. 10).

Figure 10:
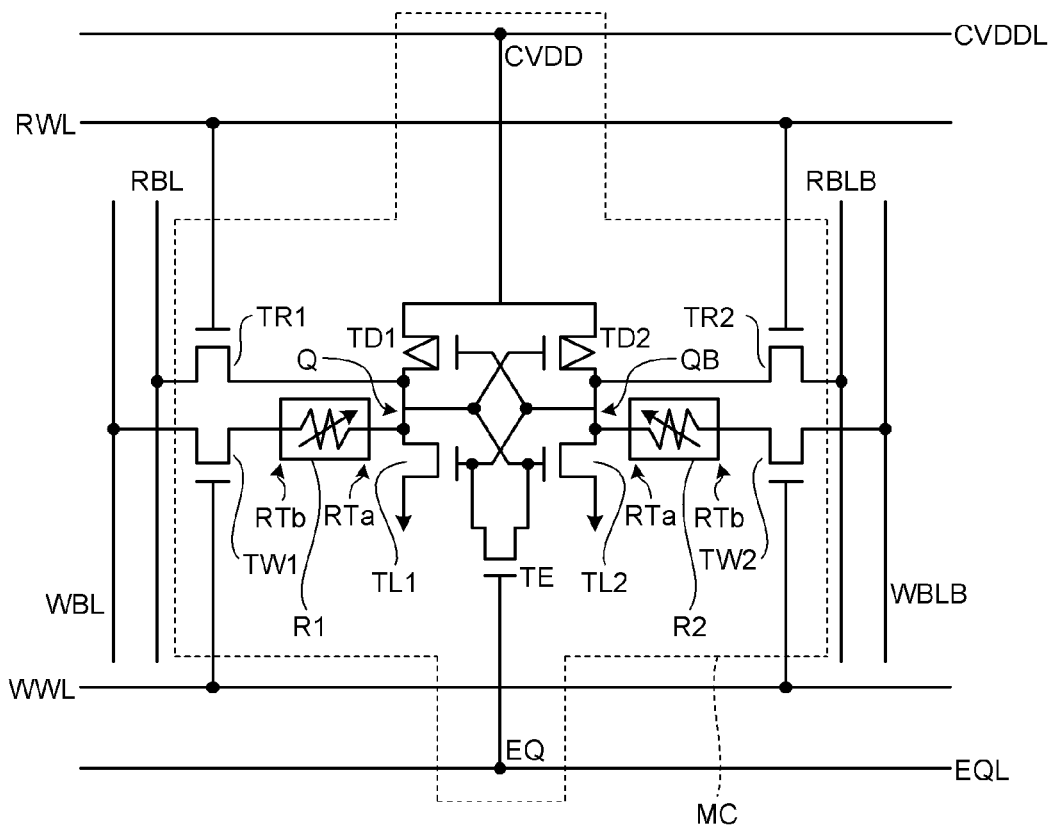
FIG. 10 is a diagram illustrating a configuration of a memory cell according to the third embodiment.

The memory cell MC further includes an equalizing transistor TE as illustrated in FIG. 10. A gate of the equalizing transistor TE is connected to the equalizing control line EQL. Further, either of a source and a drain of the equalizing transistor TE is connected to a gate of the load transistor TL1, and the other is connected to a gate of the load transistor TL2.

A write controller 211 of the write control unit 210 controls a write row decoder 212 such that potential of the equalizing control line EQL temporarily becomes the H level during the first half of a time period in which potential of a cell power line CVDDL of a selected row remains the L level selectively and temporarily. The write row decoder 212 raises potential of an equalizing control line EQL of a selected row temporarily to the H level during the first half of a time period in which potential of a cell power line CVDDL of a selected row remains the L level selectively and temporarily while maintaining potential of a cell power line CVDDL of a non-selected row to VDD (H level) and maintaining potential of an equalizing control line EQL of a non-selected row to the L level.

For example, the write row decoder 212 includes a logic circuit 212a arranged for each equalizing control line EQL. The logic circuit 212a calculates a logical product of a control signal φWWL for a write word line and a signal φDS which is obtained by delaying the control signal φWWL through an inverter 212a1 and then logically inverting the delayed control signal through an AND gate 212a2, and outputs the calculation result as a control signal φEQ of the equalizing control line EQL.

Figure 11:
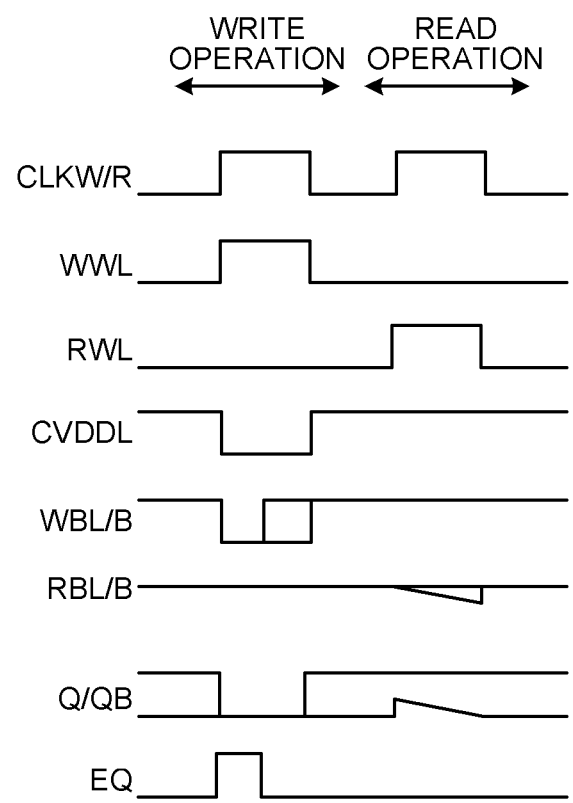
FIG. 11 is a diagram illustrating an operation of the memory cell according to the third embodiment.

Specifically, as illustrated in FIG. 11, potential of the cell power line CVDDL is lowered from VDD (H level) to the L level for the operation of writing data in the memory cell MC. Then, potential of the equalizing control line EQL is raised from the L level to the H level. As a result, the equalizing transistor TE is turned on, and thus potential of a gate of the load transistor TL1 is equal to potential of a gate of the load transistor TL2. Thus, potentials of the storage nodes Q and QB can equally become the L level.

Thereafter, potential of the equalizing control line EQL is lowered from the H level to the L level. As a result, the equalizing transistor TE is turned off. Then, predetermined levels are applied to the write bit line WBL and the inverted write bit line WBLB, respectively, in a state in which the H level is applied to the write word line WWL. As a result, signals corresponding to data can be written in the variable resistance elements R1 and R2.

As described above, according to the third embodiment, in the memory cell MC, potential of the equalizing control line EQL is temporarily raised to the H level during the first half of a time period in which potential of the cell power line CVDDL remains the L level. As a result, the equalizing transistor TE is turned on, and potentials of the storage nodes Q and QB can equally become the L level. Thereafter, control is performed such that potential of the equalizing control line EQL is returned to the L level and thereafter potential of the cell power node CVDD is returned from the L level to the H level. As a result, when resistances of the variable resistance elements R1 and R2 in the off state are sufficiently high, the L level can be easily written in a bit line connected to the variable resistance element R1 or R2 at the high resistance side. In other words, a probability capable of successfully writing the L level in a bit line connected to the variable resistance element R1 or R2 at the high resistance side can be further increased, a product yield in the write operation can be improved.

Figure 12:
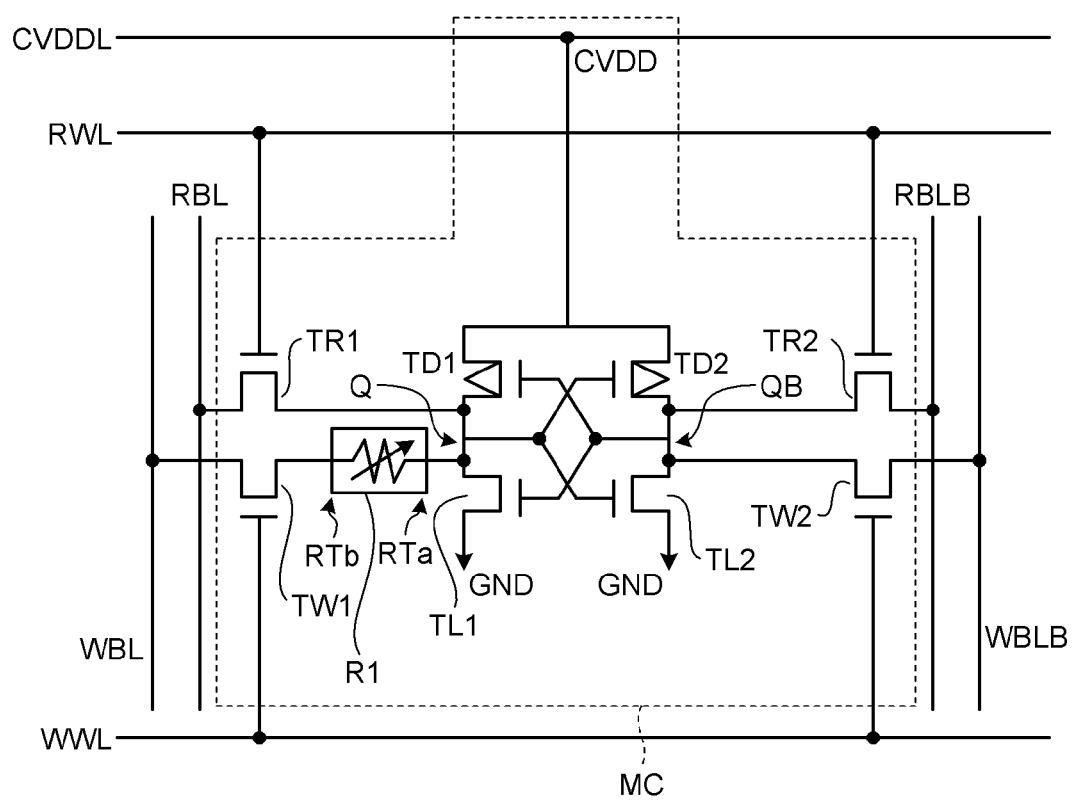
FIG. 12 is a diagram illustrating a configuration of a memory cell according to a fourth embodiment.

Further, in the first embodiment to the third embodiment, each memory cell MC may have a configuration in which either of the variable resistance element R1 and the variable resistance element R2 is not arranged. For example, FIG. 12 illustrates a configuration in which the variable resistance element R2 is removed from the memory cell MC according to the second embodiment. In this case, in each memory cell MC, the number of the variable resistance elements R1 and R2 can be reduced, and thus the area size of each memory cell MC can be easily reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising a memory cell, the memory cell comprising:
a first driving transistor connected to a first storage node;
a first load transistor connected to the first storage node; a first read transfer transistor between the first storage node and a first read node;
a first write transfer transistor between the first storage node and a first write node; a second driving transistor connected to a second storage node;
a second load transistor connected to the second storage node;
a second read transfer transistor between the second storage node and a second read node;
a second write transfer transistor between the second storage node and a second write node; and
one or more variable resistance elements having a resistance that changes depending on a direction of a bias applied to both terminals,
wherein the one or more variable resistance elements are in one of a portion between the first storage node and the first write transfer transistor and a portion between the second storage node and the second write transfer transistor, but not in the other.

2. The semiconductor memory device according to claim 1, wherein the variable resistance element comprises a ReRAM memory device.

3. The semiconductor memory device according to claim 1, wherein the variable resistance element comprises an MRAM memory device.

4. The semiconductor memory device according to claim 1, wherein the variable resistance element comprises a FeRAM memory device.

5. The semiconductor memory device according to claim 1, wherein the variable resistance element comprises one terminal electrically connected to the first storage node and the other terminal electrically connected to the first write transfer transistor, and
wherein the variable resistance element enters a low resistance state when a low voltage level is applied to the one terminal and a high voltage level is applied to the other terminal, and enters a high resistance state when a high voltage level is applied to the one terminal and a low voltage level is applied to the other terminal.

6. The semiconductor memory device according to claim 5, wherein the first write transfer transistor functions as a transfer gate for the first storage node for a writing operation, and wherein the first write transfer transistor functions as a control gate between the first storage node and the variable resistance element for a storing operation and a restoring operation.

7. The semiconductor memory device according to claim 1, wherein the variable resistance element comprises one terminal electrically connected to the second storage node and the other terminal electrically connected to the second write transfer transistor, and
wherein the variable resistance element enters a low resistance state when a low voltage level is applied to the one terminal and a high voltage level is applied to the other terminal, and enters a high resistance state when a high voltage level is applied to the one terminal and a low voltage level is applied to the other terminal.

8. The semiconductor memory device according to claim 5, wherein the second write transfer transistor functions as a transfer gate for the second storage node for a writing operation, and wherein the second write transfer transistor functions as a control gate between the second storage node and the variable resistance element for a storing operation and a restoring operation.

9. The semiconductor memory device according to claim 1, wherein the first driving transistor is connected between the first storage node and a cell power node,
the second driving transistor is connected between the second storage node and the cell power node, and
during an operation of writing data in the first storage node and the second storage node, a potential of the cell power node is lowered from a first potential to a second potential, the second potential lower than the first potential, the potential is maintained at the second potential for a period of time and after the period of time has elapsed, the cell power node is returned from the second potential to the first potential.

10. The semiconductor memory device according to claim 9,
wherein the potential of the cell power node is lowered from the first potential to the second potential and is maintained at the second potential for a period of time sufficient to cause the first storage node and the second storage node to become the second potential.

11. The semiconductor memory device according to claim 9, further comprising:
a plurality of memory cells arranged in a row direction and a column direction; and
a plurality of cell power lines, each cell power line extending in a row direction and commonly connected to the cell power nodes of the plurality of the memory cells arranged in the row direction.

12. The semiconductor memory device according to claim 9,
wherein the memory cell further comprises an equalizing transistor, wherein one of a source and a drain of the equalizing transistor is connected to a gate of the first load transistor, and the other is connected to a gate of the second load transistor.

13. The semiconductor memory device according to claim 12,
wherein the equalizing transistor is turned on during a first half of a time period in which the potential of the cell power node is maintained at the second potential and is turned off during a second half of the time period.

14. The semiconductor memory device according to claim 12, further comprising:
a plurality of memory cells arranged in a row direction and a column direction; and
a plurality of equalizing control lines, each equalizing control line extending in a row direction and commonly connected to gates of the equalizing transistors of the plurality of the memory cells arranged in the row direction.

15. The semiconductor memory device according to claim 11,
wherein the memory cell further comprises an equalizing transistor, wherein one of a source and a drain of the equalizing transistor is connected to a gate of the first load transistor, and the other is connected to a gate of the second load transistor.

16. The semiconductor memory device according to claim 15,
   wherein the equalizing transistor is turned on during a first half of a time period in which the potential of the cell power node is maintained at the second potential and is turned off during a second half of the time period.

17. The semiconductor memory device according to claim 15, further comprising
   a plurality of equalizing control lines, each equalizing control line extending in a row direction and commonly connected to gates of the equalizing transistors of the plurality of the memory cells arranged in the row direction.

* * * * *